(12) United States Patent
Yoko et al.

(10) Patent No.: US 8,364,434 B2
(45) Date of Patent: Jan. 29, 2013

(54) CALIBRATION CIRCUIT

(75) Inventors: Hideyuki Yoko, Tokyo (JP); Hiroki Fujisawa, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 173 days.

(21) Appl. No.: 12/611,598

(22) Filed: Nov. 3, 2009

(65) Prior Publication Data
US 2010/0045359 A1     Feb. 25, 2010

Related U.S. Application Data

(62) Division of application No. 11/841,286, filed on Aug. 20, 2007, now Pat. No. 7,869,973.

(30) Foreign Application Priority Data

Aug. 21, 2006 (JP) ................................. 2006-224578

(51) Int. Cl.
*G01R 35/00* (2006.01)
(52) U.S. Cl. ....................................................... 702/107
(58) Field of Classification Search .................. 702/107; 324/601; 710/48
See application file for complete search history.

(56) References Cited

U.S. PATENT DOCUMENTS

| | | | |
|---|---|---|---|
| 5,896,547 A * | 4/1999 | Lee ................... | 710/48 |
| 6,064,224 A | 5/2000 | Esch, Jr. et al. | |
| 6,480,798 B2 * | 11/2002 | Lee ............... | 702/107 |
| 6,509,778 B2 | 1/2003 | Braceras et al. | |
| 6,927,600 B2 | 8/2005 | Choe | |
| 7,084,663 B2 | 8/2006 | Oguri | |
| 7,215,128 B2 * | 5/2007 | Fujisawa ....................... | 324/601 |
| 2003/0218477 A1 | 11/2003 | Jang et al. | |
| 2004/0021481 A1 | 2/2004 | Ohno | |
| 2006/0087339 A1 | 4/2006 | Chung et al. | |
| 2006/0158198 A1 | 7/2006 | Fujisawa | |
| 2007/0148796 A1 | 6/2007 | Nakamura et al. | |

FOREIGN PATENT DOCUMENTS

| | | |
|---|---|---|
| JP | 11-27132 | 1/1999 |
| JP | 2000-59202 | 2/2000 |
| JP | 2002-152032 | 5/2002 |
| JP | 2003-204258 | 7/2003 |
| JP | 2004-032070 | 1/2004 |
| JP | 2005-026890 | 1/2005 |
| JP | 2005-159702 | 6/2005 |
| JP | 2006-203405 | 8/2006 |
| JP | 2007-123987 | 5/2007 |
| TW | 589794 | 6/2004 |
| TW | 223277 | 11/2004 |
| TW | I259477 | 8/2006 |

OTHER PUBLICATIONS

Taiwanese Official Action dated Jul. 23, 2010.

* cited by examiner

*Primary Examiner* — Jonathan C Teixeira Moffat
*Assistant Examiner* — Xiuquin Sun
(74) *Attorney, Agent, or Firm* — Scully, Scott, Murphy & Presser PC

(57) ABSTRACT

To include a first replica buffer that has substantially the same circuit configuration as a pull-up circuit which constitutes an output buffer and a second replica buffer that has substantially the same circuit configuration as a pull-down circuit which constitutes the output buffer. When a first calibration command ZQCS is issued, either a control signal ACT1 or ACT2 is activated, and a calibration operation is performed for either the first replica buffer or the second replica buffer. When a second calibration command ZQCL is issued, both of the control signals ACT1, ACT2 are activated and the calibration operation is performed for both the first replica buffer and the second replica buffer.

12 Claims, 13 Drawing Sheets

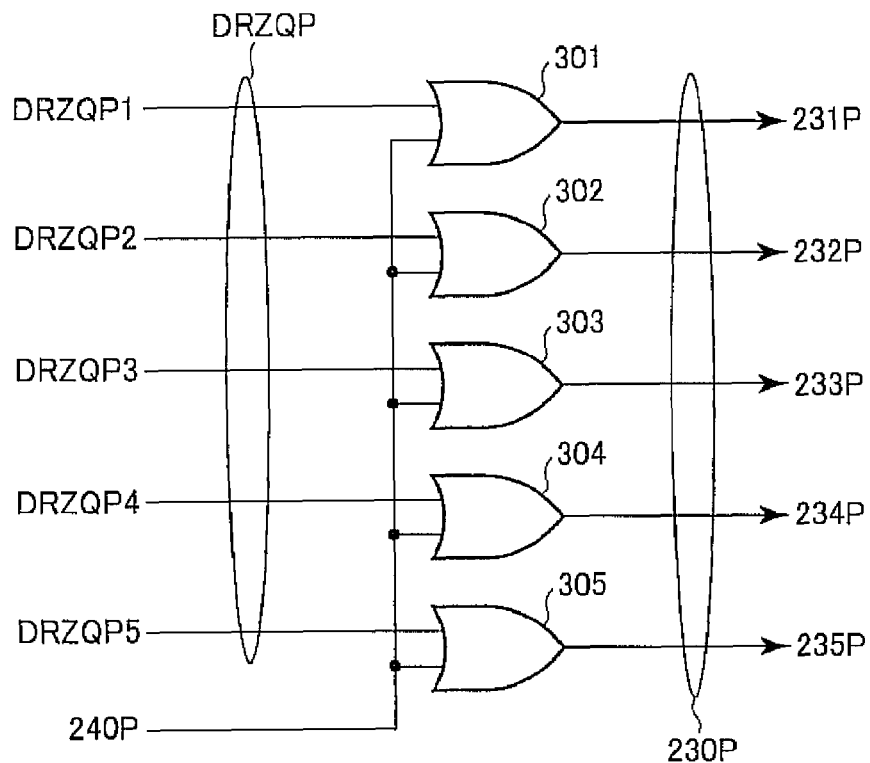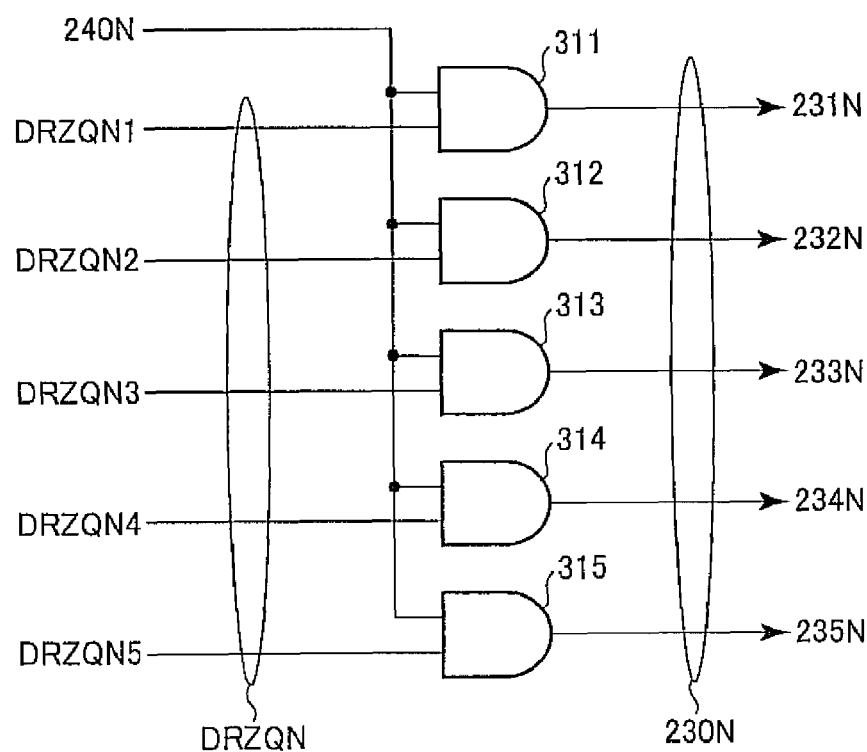
FIG.8

CALIBRATION CIRCUIT

REFERENCE TO RELATED APPLICATIONS

The present application is a divisional application of U.S. Ser. No. 11/841,286, filed Aug. 20, 2007, the entire contents of which are incorporated herein by reference.

TECHNICAL FIELD

The present invention relates to a calibration circuit, and, particularly to a calibration circuit for adjusting the impedance of an output buffer provided in a semiconductor device. The present invention also relates to a data processing system that includes a semiconductor memory device having a calibration circuit.

BACKGROUND OF THE INVENTION

In recent years, significantly high data transfer rate is required for data transfer between semiconductor devices (between CPUs and memories for example). To accomplish high data transfer rate, the amplitude of input/output signals is increasingly reduced. If the input/output signals have reduced amplitudes, the desired accuracy of impedances of output buffers becomes severe.

The impedance of the output buffer varies depending on process conditions during the manufacturing. Also, during its actual use, the impedance of the output buffer is affected by variations in ambient temperature and power source voltage. When high impedance accuracy is required for the output buffer, output buffers that can adjust their impedances are utilized (Japanese Patent Application Laid-open Nos. 2002-152032, 2004-32070, 2006-203405, and 2005-159702). The impedance of such an output buffer is adjusted by circuits generally called "calibration circuits".

As disclosed in Japanese Patent Application Laid-open Nos. 2006-203405, and 2005-159702, the calibration circuit includes a replica buffer with the same configuration as the output buffer. When a calibration operation is performed, with an external resistor connected to a calibration terminal, the voltage of the calibration terminal is compared to the reference voltage and the impedance of the replica buffer is adjusted accordingly. The result of adjustment of the replica buffer is then reflected in the output buffer, and the impedance of the output buffer is thus set to the desired value.

In the sequence to the calibration operation, an adjustment step that includes comparison of voltage and update of impedances of replica buffers is performed for a plurality of times. The impedance of the replica buffer is made to be close to the desired value.

However, the comparison of voltage and the change of impedance of the replica buffer in the calibration operation take a certain amount of time. Therefore, if the frequency of an external clock is high, the adjustment step is not performed every time the external clock is activated. In such a case, an internal clock with lower frequency is generated by dividing the external clock and the adjustment step is performed in synchronization with the internal clock.

The period in which the calibration operation is performed (a calibration period) is usually determined by the number of external clock cycles (e.g., 64 clock cycles). As the number of divisions of the external clock is increased, the number of adjustment steps performed during the calibration period is reduced. Assume that the number of external clock cycles that determines the calibration period is indicated by m and the number of divisions is indicated by n, the number of activations of the internal clock in a calibration period, i.e., the number of adjustment steps is indicated by m/n. If the frequency of the external clock is increased, the number of divisions n must be increased, and thus the number of adjustment steps performed in a calibration period is further reduced.

Generally, in the calibration operation, the replica buffer that has the same circuit configuration as a pull-up circuit included in the output buffer is adjusted, and then the replica buffer that has the same circuit configuration as a pull-down circuit included in the output buffer is adjusted. In conventional calibration circuits, a calibration period is divided into the first half and the second half. During the first half, the pull-up replica buffer is adjusted and the pull-down replica buffer is adjusted during the second half.

Accordingly, the numbers of adjustment steps performed for the pull-up and pull-down replica buffers are reduced by half, respectively, and thus a sufficient calibration operation is not performed.

Further, since the ordinary calibration circuit performs a first adjustment step by using the final code in the previous calibration operation, the impedance is not updated in the first adjustment step. The impedance update begins at a second adjustment step. The number of impedance updates is less than the number of adjustment steps by one. Therefore, as the number of divisions is increased, the number of actual impedance updates is drastically reduced.

For example, assume that the number of external clock cycles that determines the calibration period m is 64 clock cycles and the number of divisions n is 8, and the number of activations of the internal clock in a calibration period is eight (=64/8). This number is assigned to the pull-up side and the pull-down side on halves. The number of adjustment steps is four both on the pull-up side and on the pull-down side. Because the impedance is not updated in the first adjustment step, the number of impedance updates is three (=4−1) both on the pull-up side and on the pull-down side.

If the speed of the external clock is increased and the number of divisions n is 16, the number of activations of the internal clock is only four (=64/16). The number of adjustment steps is two both on the pull-up side and on the pull-down side. The number of impedance updates is one (=2−1). If the speed of the external clock is more increased and the number of divisions n is also more increased, the number of impedance updates is zero. In such a case, the calibration operation cannot be performed.

SUMMARY OF THE INVENTION

The present invention has been developed to solve the problems described above. Therefore, an object of the present invention is to provide a calibration circuit that performs a calibration operation sufficiently even if frequency of an external clock is high.

A calibration circuit according to one aspect of the present invention comprises:

a first replica buffer that has substantially the same circuit configuration as one of a pull-up circuit and a pull-down circuit included in an output buffer; and a second replica buffer that has substantially the same circuit configuration as the other of the pull-up circuit and the pull-down circuit, wherein in response to a first calibration command, a calibration operation for the first replica buffer and a calibration operation for the second replica buffer are performed alternately.

A calibration circuit according to another aspect of the present invention comprises:

a first replica buffer that has substantially the same circuit configuration as one of a pull-up circuit and a pull-down circuit included in an output buffer; and a second replica buffer that has substantially the same circuit configuration as the other of the pull-up circuit and the pull-down circuit, wherein in response to a first calibration command, a calibration operation is performed for either the first replica buffer or the second replica buffer, and in response to a second calibration command, the calibration operation is performed for both the first replica buffer and the second replica buffer.

According to the present invention, when a first calibration command is issued, not both a calibration operation for a first replica buffer and a calibration operation for a second replica buffer but either of them is performed. Accordingly, the number of updates of impedance in a calibration period is increased, and even if the frequency of an external clock is high, a sufficient calibration operation can be performed.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 8 is a circuit diagram of the pre-stage circuit shown in FIG. 6;

DETAILED DESCRIPTION OF THE EMBODIMENTS

Preferred embodiments of the present invention will now be explained in detail with reference to the drawings.

Figure 1:
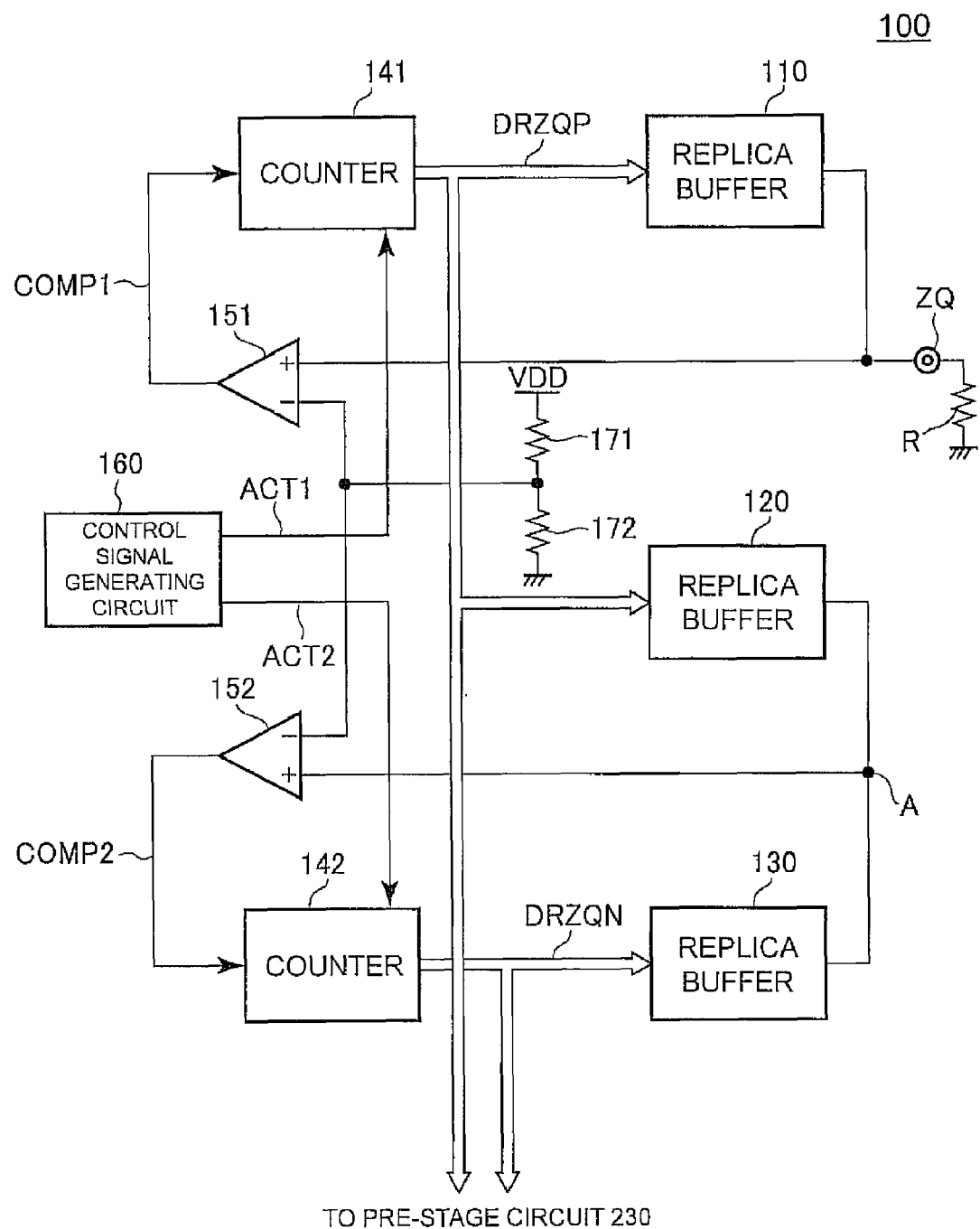
FIG. 1 is a circuit diagram of a calibration circuit according to a preferred embodiment of the present invention.

FIG. 1 is a circuit diagram of a calibration circuit 100 according to a preferred embodiment of the present invention.

As shown in FIG. 1, the calibration circuit 100 of the present embodiment includes replica buffers 110, 120, and 130, a counter 141 for controlling the impedances of the replica buffers 110 and 120, a counter 142 for controlling the impedance of the replica buffer 130, a comparator 151 for controlling the counter 141, a comparator 152 for controlling the counter 142, and a control signal generating circuit 160.

The replica buffers 110, 120, and 130 have the same circuit configuration as a part of an output buffer which will be described later. The output impedance is adjusted by using the replica buffers 110, 120, and 130 and the result is reflected in the output buffer. The impedance of the output buffer is thus set to the desired value. That is the function of the calibration circuit 100.

Figure 2:
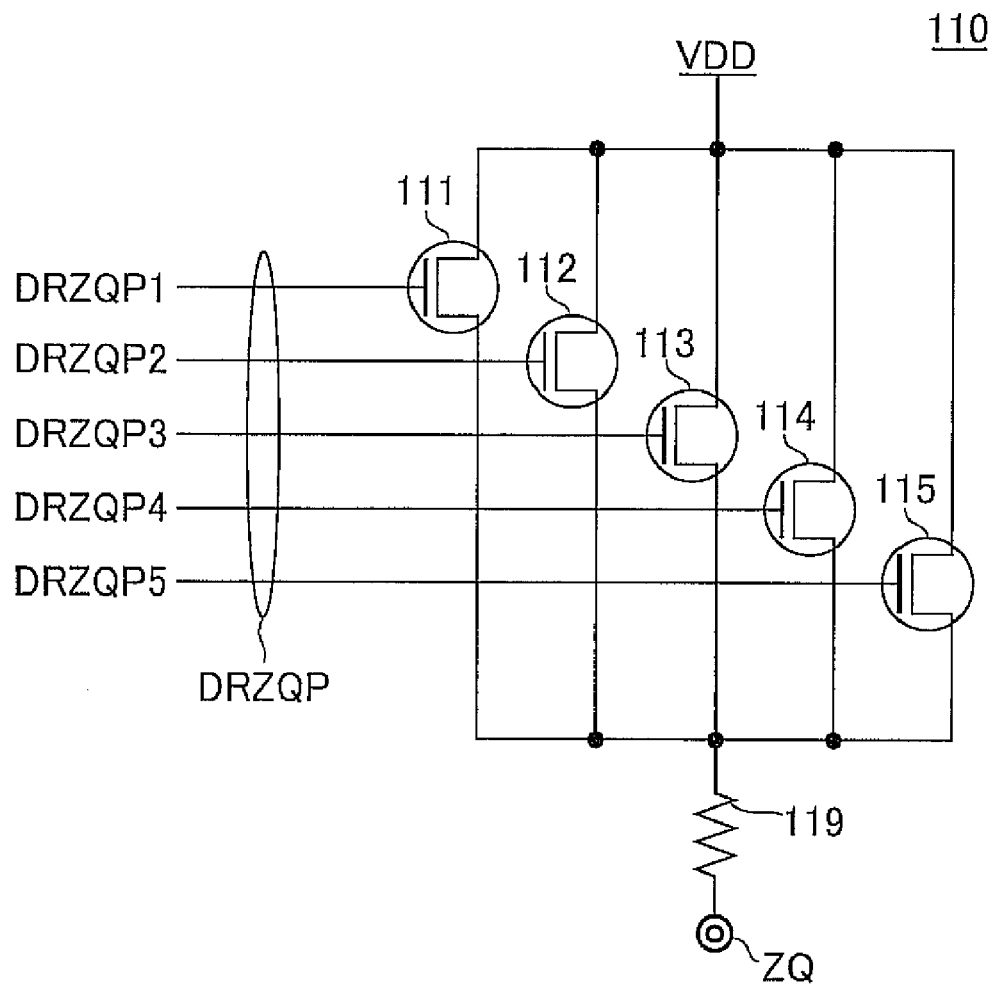
FIG. 2 is a circuit diagram of the replica buffer of pull-up side shown in FIG. 1.

FIG. 2 is a circuit diagram of the replica buffer 110.

As shown in FIG. 2, the replica buffer 110 is formed by five P-channel MOS transistors 111 to 115 connected in parallel to a power source potential VDD and a resistor 119 with its one end being connected to the drains of the transistors. The other end of the resistor 119 is connected to a calibration terminal ZQ. The replica buffer 110 does not have a pull-down function. Instead, this buffer has only a pull-up function.

Impedance control signals DRZQP1 to DRZQP5 are provided to the gates of the transistors 111 to 115 from the counter 141. Five transistors in the replica buffer 110 perform on-off controls separately. In FIGS. 1 and 2, the impedance control signals DRZQP1 to DRZQP5 are collectively referred to as DRZQP.

The parallel circuit of the transistors 111 to 115 is designed so as to have predetermined impedance (e.g., 120Ω) in active state. However, because the on-resistance of the transistor varies depending on manufacturing conditions, environmental temperatures, and power source voltages during the operation, the desired impedance may not be obtained. To accomplish 120Ω of the impedance actually, the number of transistors to be turned on must be adjusted. The parallel circuit of a plurality of transistors is thus utilized.

To adjust the impedance closely over a wide range, W/L ratios (ratios of gate width to gate length) of the plurality of transistors constituting the parallel circuit are preferably different from one another. More preferably, a power of two weighting is performed upon the transistors. In view of this point, according to the present embodiment, when the W/L ratio of the transistor 111 is set to "1", the W/L ratios of the transistors 112 to 115 are "2", "4", "8", and "16", respectively (these W/L ratios do not represent actual W/L ratios but relative values, which will also apply to the following description.).

By selecting appropriately transistors to be turned on by the impedance control signals DRZQP1 to DRZQP5, the on resistance of the parallel circuit is fixed to about 120Ω regardless of variations in the manufacturing conditions and the temperature changes.

The resistance value of the resistor 119 is designed to be 120Ω, for example. Therefore, when the parallel circuits of the transistors 111 to 115 are turned on, the impedance of the replica buffer 110 is 240Ω as seen from the calibration terminal ZQ. For example, a tungsten (W) resistor is utilized for the resistor 119.

The replica buffer 120 has the same circuit configuration as the replica buffer 110 shown in FIG. 2 except that the other end of the resistor 119 is connected to a node A. Therefore, the impedance control signals DRZQP1 to DRZQP5 are provided to the gates of five transistors in the replica buffer 120.

Figure 3:
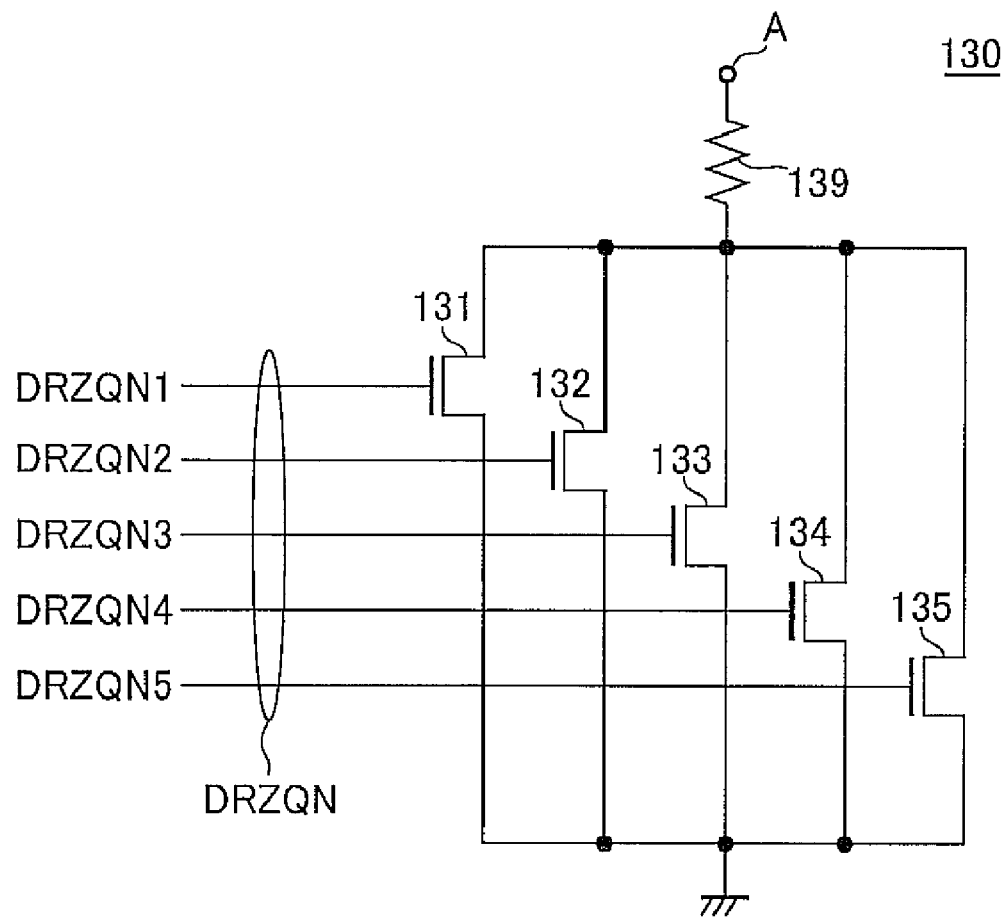
FIG. 3 is a circuit diagram of the replica buffer of pull-down side shown in FIG. 1.

FIG. 3 is a circuit diagram of the replica buffer 130.

As shown in FIG. 3, the replica buffer 130 is formed by five N-channel MOS transistors 131 to 135 connected in parallel to a ground potential and a resistor 139 with its one end being connected to the drains of the transistors. The other end of the resistor 139 is connected to the node A. The replica buffer 130 does not have the pull-up function. Instead, this buffer has only the pull-down function.

Impedance control signals DRZQN1 to DRZQN5 are provided to the gates of the transistors 131 to 135 from the counter 142. Therefore, five transistors in the replica buffer 130 perform on-off controls separately. In FIGS. 1 and 3, the impedance control signals DRZQN1 to DRZQN5 are collectively referred to as DRZQN.

The parallel circuit of the transistors 131 to 135 is designed to have e.g., 120Ω at the time of conduction. The resistance value of the resistor 139 is designed to be e.g., 120Ω. When the parallel circuit of the transistors 131 to 135 is turned on, the impedance of the replica buffer 130 is, as seen from the node A, 240Ω like the replica buffers 110 and 120.

More preferably, like the transistors 111 to 115, the power of two weighting is performed upon the W/L ratios of the transistors 131 to 135. Specifically, when the W/L ratio of the transistor 131 is "1", the W/L ratios of the transistors 132 to are set to "2", "4", "8", and "16", respectively.

Referring to FIG. 1 again, the counter 141 counts up or down an impedance code when a control signal ACT1 is activated. Specifically, if a comparison signal COMP1 is high level during activation of the control signal ACT1, the counter 14 counts up the impedance code. If the comparison signal COMP1 is low level during activation of the control signal ACT1, the counter counts down the impedance code. If the logic level of the comparison signal COMP1 at the time of activation of the control signal ACT1 is different from the previous one, the count operation is stopped In the present embodiment, activation of the control signal ACT1 indicates an active edge of the control signal ACT1.

The non-inverting input terminal (+) of the comparator 151 is connected to the calibration terminal ZQ. The inverting input terminal (−) is connected to the intermediate point of resistors 171 and 172 connected between a power source potential (VDD) and a ground potential (GND). The comparator 151 compares the potential of the calibration terminal ZQ to an intermediate voltage (VDD/2). If the potential is higher, the comparison signal COMP1 serving as the output is made to be high level. If the intermediate voltage is higher, the comparison signal COMP1 is made to be low level.

The counter 142 counts up or down the impedance code when the control signal ACT2 is activated. Specifically, if a comparison signal COMP2 is high level during activation of the control signal ACT2, the counter counts up the impedance code. If the comparison signal COMP2 is low level during activation of the control signal ACT2, the counter counts down the impedance code. If the logic level of the comparison signal COMP2 during activation of the control signal ACT2 is different from the previous one, the count operation is stopped. In the present embodiment, activation of the control signal ACT2 indicates an active edge of the control signal ACT2.

The non-inverting input terminal (+) of the comparator 152 is connected to the node A serving as the output end of the replica buffers 120 and 130. The inverting input terminal (−) is connected to the intermediate point of the resistors 171 and 172. The comparator 152 compares the voltage of the node A to the intermediate voltage (VDD/2). If the voltage of the node A is higher, the comparison signal COMP2 serving as the output is made to be high level. If the intermediate voltage is higher, the comparison signal COMP2 is made to be low level.

Further, during the period that the control signals ACT1 and ACT2 are non-activated, the counters 141 and 142 stop the count operation and maintain their present impedance code. As described above, the count value of the counter 141 is utilized as the impedance control signal DRZQP. The count value of the counter 142 is utilized as the impedance control signal DRZQN.

Figure 4:
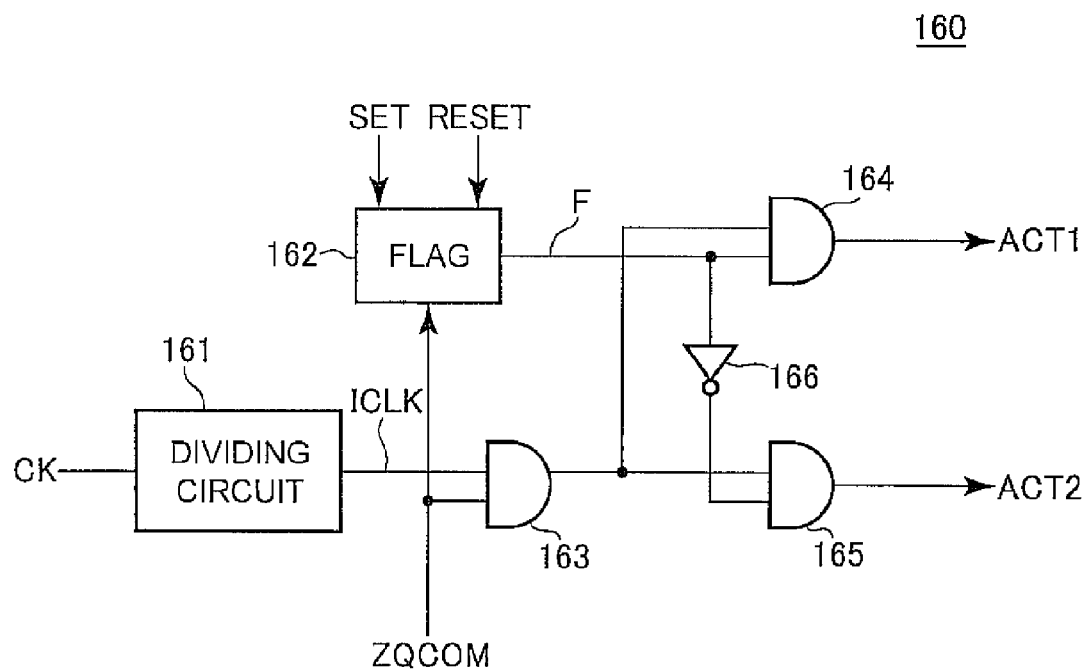
FIG. 4 is a circuit diagram of the control signal generating circuit shown in FIG. 1.

FIG. 4 is a circuit diagram of the control signal generating circuit 160 for generating the control signals ACT1 and ACT2.

As shown in FIG. 4, the control signal generating circuit 160 has a dividing circuit 161 which divides an external clock CK so as to generate an internal clock ICLK and a f lag 162 which selects the control signal ACT1 or ACT2 to be activated.

Figure 5:
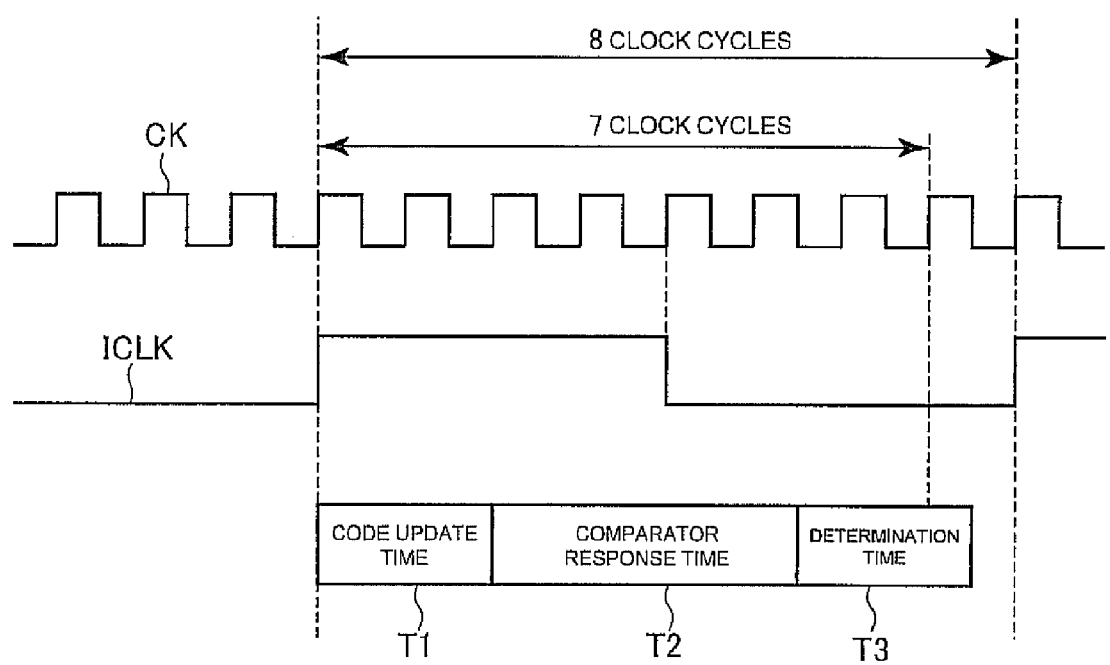
FIG. 5 is an example of a timing chart showing one adjustment step.

The number of divisions in the dividing circuit 161 is determined considering the relationship between the frequency of the external clock CK and the operation speed of the calibration circuit 100. Specifically, in the range that the period of the internal clock ICLK is longer than the time required for performing an adjustment step, the number of divisions is preferably set to be as small as possible. As shown in FIG. 5, one adjustment step includes a code update time T1, a comparator response time T2, and a determination time T3. As shown in FIG. 5, if the total time (=T1+T2+T3) is longer than seven external clock cycles and shorter than eight external clock cycles, the number of divisions is set to eight.

As shown in FIG. 4, the internal clock ICLK is input to one end of an AND circuit 163. A control signal ZQCOM which is high level during the calibration period is input to the other end of the AND circuit 163. Accordingly, the output of the AND circuit 163 is such that only when the control signal ZQCOM is high level, the internal clock ICLK is passed.

There are two types of externally issued calibration command. One is a "short calibration" command. Another is a "long calibration" command. The short calibration command (ZQCS) is issued as needed during an ordinary operation. Its calibration period is set to be relatively short. Meanwhile, the long calibration command (ZQCL) is issued at the time of reset or returning from a self refresh mode. The calibration period is set to be relatively long.

The calibration period assigned to the short calibration command is, e.g., 64 clocks. In this case, if the number of divisions is eight, the adjustment step is performed for eight times (=64/8) in a short calibration. The calibration period assigned to the long calibration command is, e.g., 512 clocks. If the number of divisions is eight, the adjustment step is performed for 64 times (=512/8) in a long calibration.

The flag 162 selects the control signal ACT1 or ACT2 to be activated. A set signal SET, a reset signal RESET, and the control signal ZQCOM are input to the flag 162. The set signal SET sets the content of the flag 162 to "1" and is activated when a chip is reset or when the long calibration command is issued. Meanwhile, the reset signal RESET resets the content of the flag 162 to "0" and is activated when the long calibration command is issued and then the half of the calibration period elapses.

In response to the control signal ZQCOM changed from high level to low level, the flag 162 inverts its content. The control signal ZQCOM is changed from high level to low level when the calibration operation is completed. Unless the chip is reset or the long calibration command is issued, the content of the flag is inverted every short calibration operation.

As shown in FIG. 4, the output F of the flag 162 is provided to an AND circuit 164. An inversion signal generated by an inverter 166 is provided to an AND circuit 165. Therefore, the control signal generating circuit 160 outputs the control signal ACT1 when the flag 162 is set to 1, and outputs the control signal ACT2 when the flag 162 is reset to 0.

The configuration of the calibration circuit 100 according to the present embodiment has been described.

Figure 6:
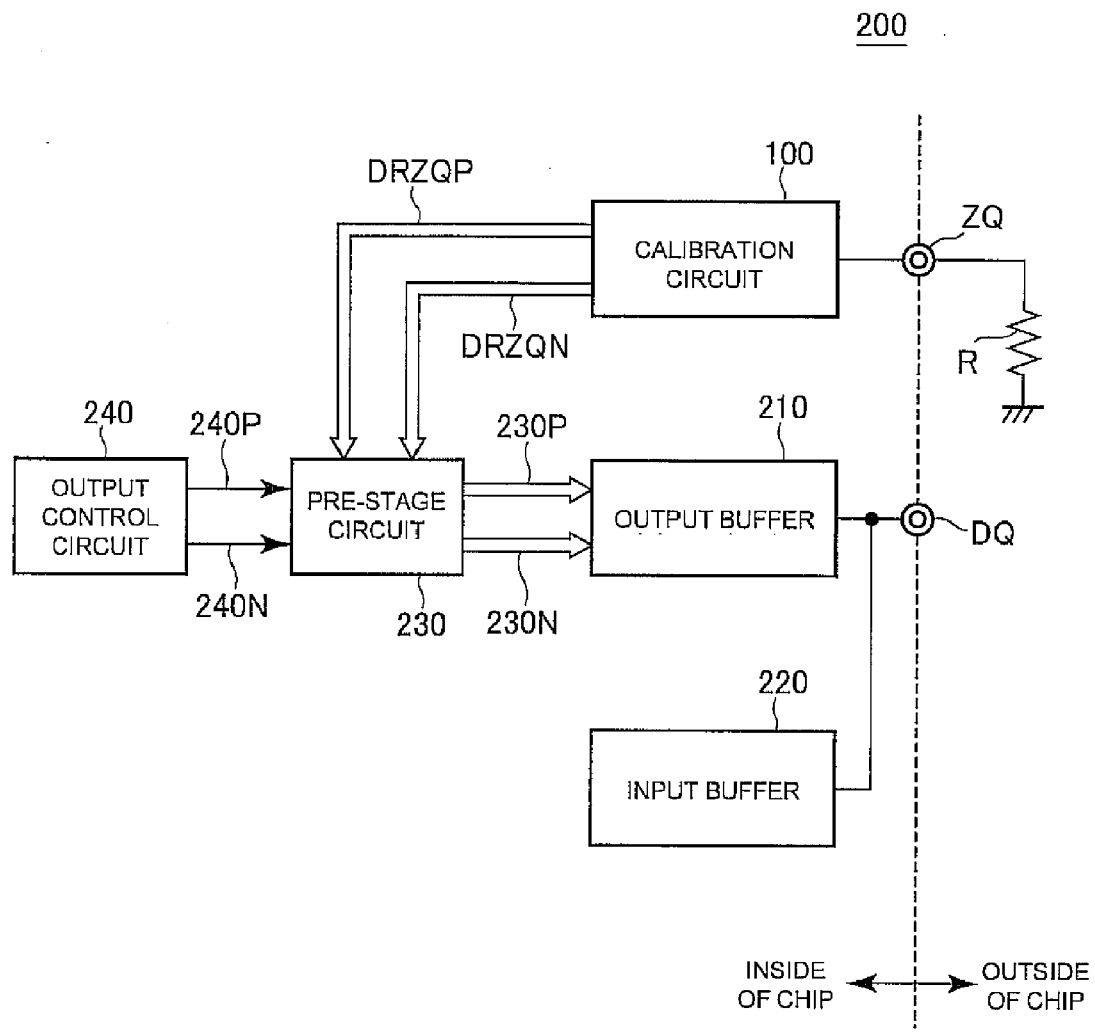
FIG. 6 is a block diagram of main parts of a semiconductor device that includes the calibration circuit shown in FIG. 1.

FIG. 6 is a block diagram of main parts of a semiconductor device 200 that includes the calibration circuit 100.

The semiconductor device 200 shown in FIG. 6 includes, in addition to the calibration circuit 100, an output buffer 210 and input buffer 220 that are connected to a data input/output terminal DQ. Since the configuration of the input buffer 220 is not directly relevant to the scope of the present invention, its description will be omitted in the specification.

The operation of the output buffer 210 is controlled by operation signals 230P and 230N provided from a pre-stage circuit 230. As shown in FIG. 6, the impedance control signals DRZQP and DRZQN provided from the calibration circuit 100 are provided to the pre-stage circuit 230.

Figure 7:
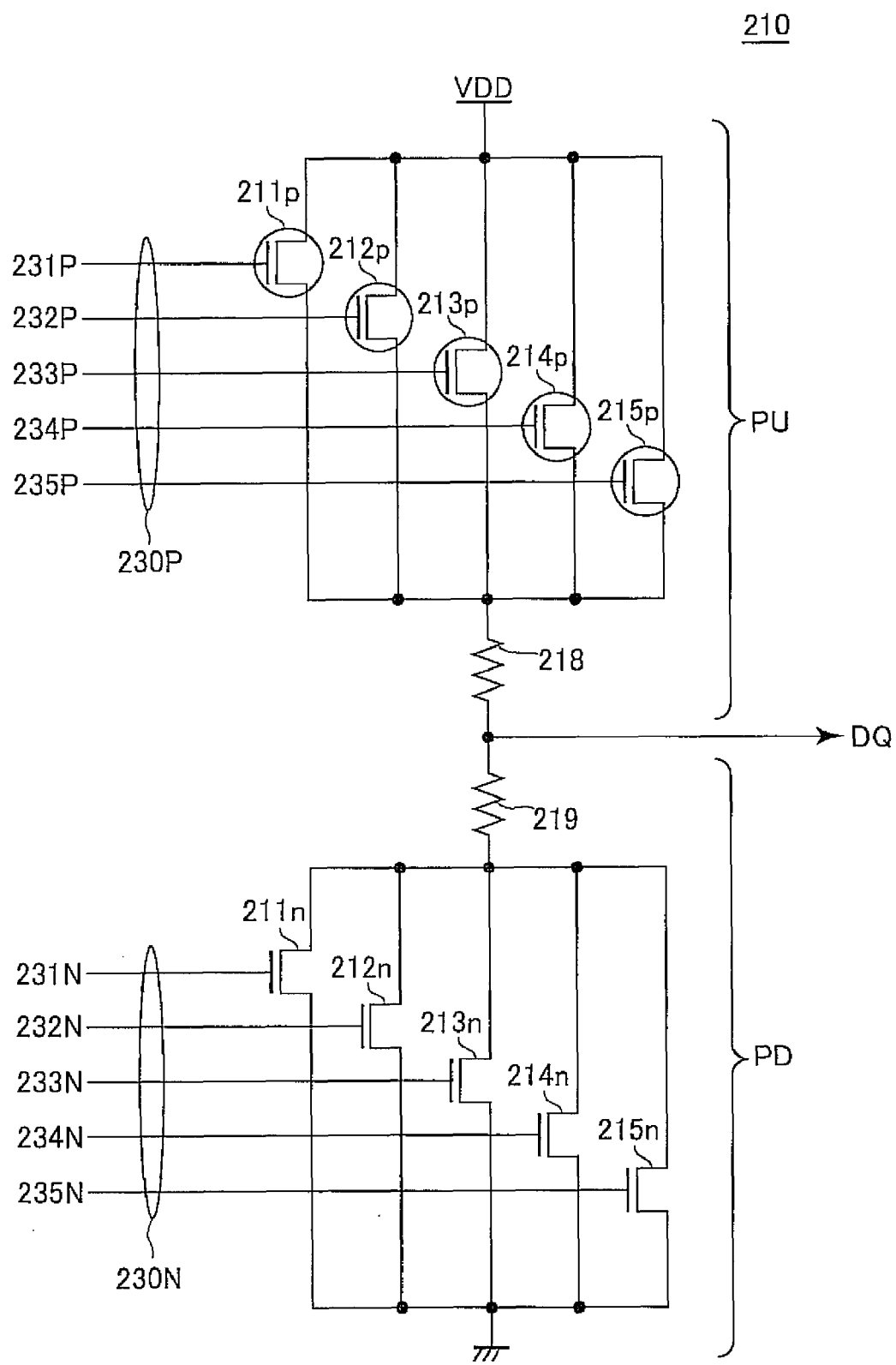
FIG. 7 is a circuit diagram of the output buffer shown in FIG. 6.

FIG. 7 is a circuit diagram of the output buffer 210.

As shown in FIG. 7, the output buffer 210 includes five P-channel MOS transistors 211p to 215p connected in parallel and five N-channel MOS transistors 211n to 215n connected in parallel. Resistors 218 and 219 are serially connected between the transistors 211p to 215p and the transistors 211n to 215n. The connection point of the resistor 218 and the resistor 219 is connected to the data input/output terminal DQ.

Five operation signals 231P to 235P that constitute an operation signal 230P are provided to the gates of the transistors 211p to 215p. Five operation signals 231N to 235N that constitute an operation signal 230N are provided to the gates of the transistors 211n to 215n. Ten transistors in the output buffer 210 are on-off controlled separately by ten operation signals 231P to 235P and 231N to 235N. The operation signals 231P to 235P constitute the operation signal 230P, and the operation signals 231N to 235N constitute the operation signal 230N.

In the output buffer 210, a pull-up circuit PU formed by the P-channel MOS transistors 211p to 215p and the resistor 218 has the same circuit configuration as the replica buffer 110 (120) shown in FIG. 2. A pull-down circuit PD formed by the N-channel MOS transistors 211n to 215n and the resistor 219 has the same circuit configuration as the replica buffer 130 shown in FIG. 3.

Accordingly, the parallel circuit of the transistors 211p to 215p and the parallel circuit of the transistors 211n to 215n are designed to have e.g., 120Ω at the time of conduction. Resistance values of the resistors 218 and 219 are designed to be, e.g., 120Ω, respectively. Therefore, if either the parallel circuit of the transistors 211p to 215p or the parallel circuit of the transistors 211n to 215n is turned on, the impedance of the output buffer is 240Ω as seen from the data input/output terminal DQ.

In actual semiconductor devices, a plurality of these output buffers 210 are provided in parallel and the output impedance is selected depending on the number of output buffers to be used. Assume that the impedance of the output buffer is indicated by X, by using Y output buffers in parallel, the output impedance is calculated as X/Y.

FIG. 8 is a circuit diagram of the pre-stage circuit 230.

As shown in FIG. 8, the pre-stage circuit 230 is formed by five OR circuits 301 to 305 and five AND circuits 311 to 315. A selection signal 240P from an output control circuit 240 and the impedance control signals DRZQP1 to DRZQP5 from the calibration circuit 100 are provided to the OR circuits 301 to 305. Meanwhile, a selection signal 240N from the output control circuit 240 and the impedance control signals DRZQN1 to DRZQN5 from the calibration circuit 100 are provided to the AND circuits 311 to 315.

The selection signals 240P and 240N that are the outputs of the output control circuit 240 are controlled depending on logic values of data to be outputted from the data input/output terminal DQ. Specifically, when a high level signal is outputted from the data input/output terminal DQ, the selection signals 240P and 240N are set to low level. When a low level signal is outputted from the data input/output terminal DQ, the selection signals 240P and 240N are set to high level. When ODT (On Die Termination) that the output buffer 210 is used as a terminal resistor is utilized, the selection signal 240P is set to low level and the selection signal 240N is set to high level.

Operation signals 231P to 235P (=230P) that are the outputs of the OR circuits 301 to 305 and the operation signals 231N to 235N (=230N) that are the outputs of the AND circuits 311 to 315 are provided to the output buffer 210 as shown in FIG. 6.

The configuration of the semiconductor device 200 has been described. With respect to the operation of the calibration circuit 100 according to the present embodiment, the operation performed when the short calibration command is issued and the operation performed when the long calibration command is issued will be described in this order.

Figure 9:
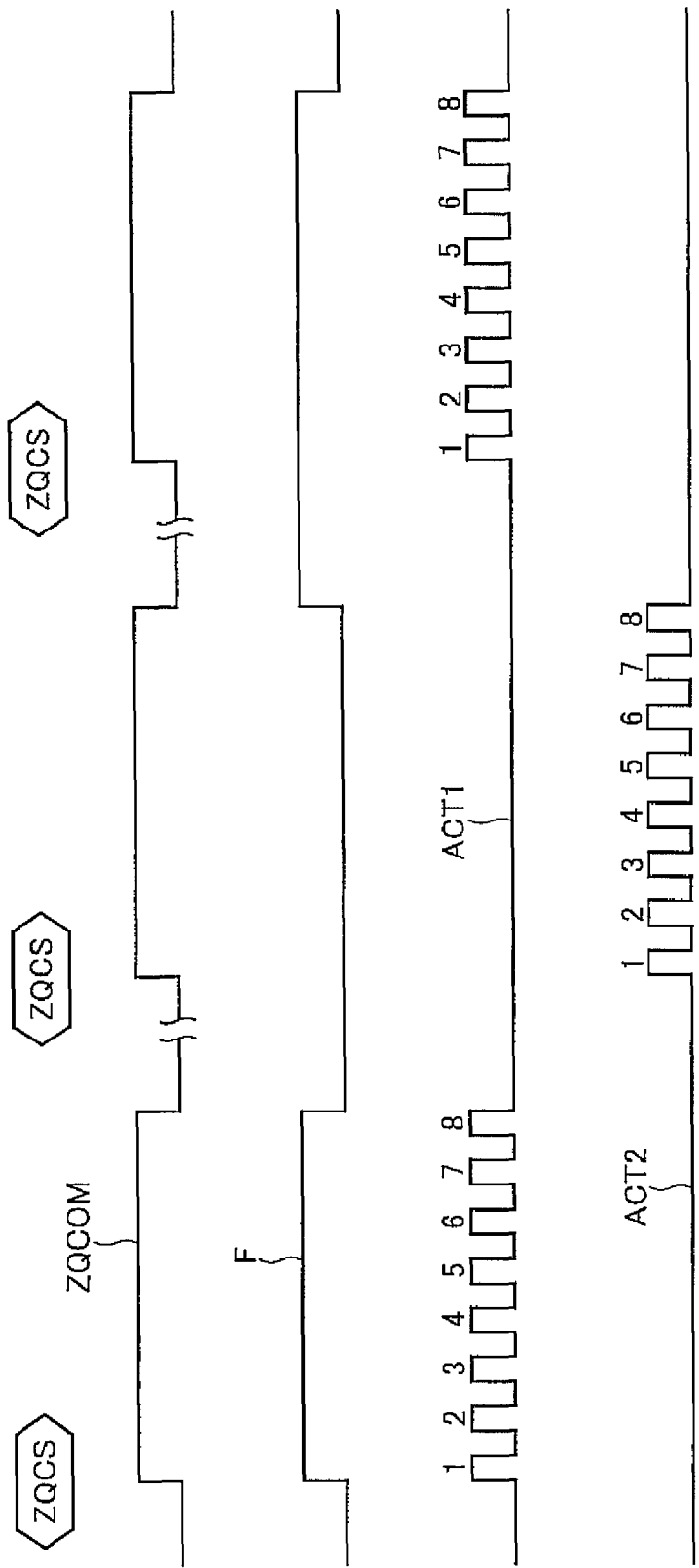
FIG. 9 is a timing diagram for explaining the short calibration operation.

FIG. 9 is a timing diagram for explaining the short calibration operation.

As shown in FIG. 9, when the short calibration command ZQCS is issued, the control signal ZQCOM is changed from low level to high level. Depending on the current content of the flag 162, the control signal ACT1 or ACT2 is clocked. According to the example shown in FIG. 9, when a first short calibration command ZQCS is issued, the output F of the flag 162 is high level. The control signal ACT1 is thus clocked in conjunction with the internal clock ICLK. The control signal ACT2 is fixed to low level.

The counter 141 then performs the count operation so as to make the impedance of the replica buffer 110 close to the value of an external resistor R. Assume that the short calibration period is 64 clocks and the number of divisions is 8, the counter performs the adjustment step up to eight times.

More specifically, when the comparison signal COMP1 which is the output of the comparator 151 is low level, the counter counts down in conjunction with the control signal ACT1 and the transistors 111 to 115 are switched on and off accordingly. As described above, in the present embodiment, the W/L ratios of the transistors 111 to 115 are "1", "2", "4", "8", and "16", respectively. The least significant bit (LSB) of the counter 141 is assigned to the impedance control signal DRZQP1. The most significant bit (MSB) of the counter 141 is assigned to the impedance control signal DRZQP5. The impedance of the replica buffer 110 is thus changed at the minimum pitch.

Figure 10:
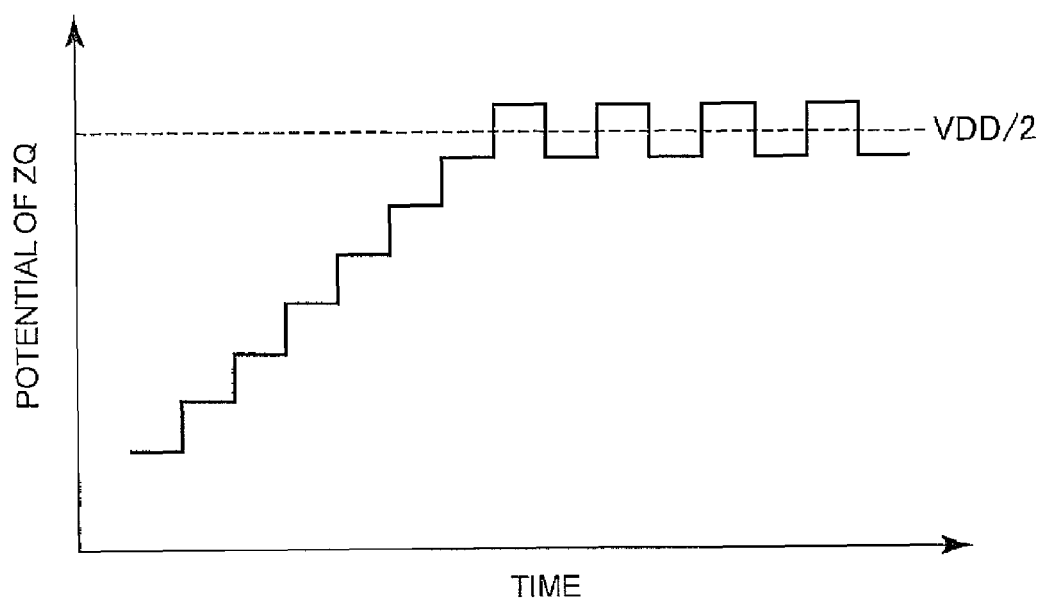
FIG. 10 is a graph showing one example of potential change at the calibration terminal.

As the count down proceeds, the impedance of the replica buffer 110 is gradually reduced. As shown in FIG. 10, the potential of the calibration terminal ZQ is gradually increased. When the impedance of the replica buffer 110 is reduced to under the target impedance (240Ω), the potential of the calibration terminal exceeds the intermediate voltage (VDD/2). The comparison signal COMP1 which is the output of the comparator is then inverted into high level. Since the logic level of the comparison signal COMP1 is changed from the previous one, the counter 141 stops the count operation.

As shown in FIG. 10, after the logic level of the comparison signal COMP1 has been changed from the previous one, the adjustment step can be performed continuously.

Figure 11:
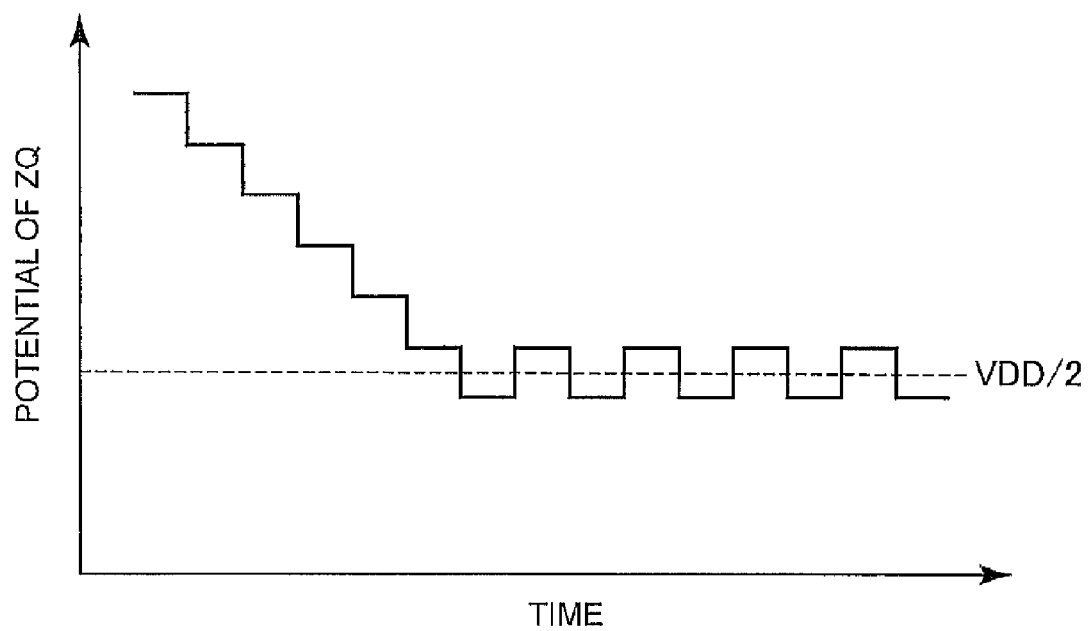
FIG. 11 is a graph showing another example of potential change at the calibration terminal.

Meanwhile, when the comparison signal COMP1 which is the output of the comparator 151 is high level, the counter 141 counts up in conjunction with the control signal ACT1. The transistors 111 to 115 are switched on and off accordingly. As the count up proceeds, the impedance of the replica buffer 110 is gradually increased. As shown in FIG. 11, the potential of the calibration terminal ZQ is gradually reduced. When the impedance of the replica buffer 110 is reduced to under the target impedance (240Ω), the potential of the calibration terminal exceeds the intermediate voltage (VDD/2). The comparison signal COMP1 which is the output of the comparator 151 is then inverted into low level. Since the logic level of the comparison signal COMP1 is changed from the previous one, the counter 141 stops the count operation.

Also in this case, as shown in FIG. 11, after the logic level of the comparison signal COMP1 has been changed from the previous one, the adjustment step can be performed continuously.

When the adjustment step is performed up to eight times, as shown in FIG. 9, the control signal ZQCOM is changed to low level. The content of the flag 162 is inverted accordingly and clocking of the control signal ACT1 is stopped. The count value of the counter 141 is fixed and the level of the impedance control signal DRZQP (DRZQP1 to DRZQP5) is determined. As the control signal ACT2 is fixed to low level, the impedance of the replica buffer 130 is fixed.

When the next short calibration command ZQCS is issued, the control signal ZQCOM is activated to be high level again. Because the output F of the flag 162 is low level, clocking of the control signal ACT2 is performed in conjunction with the internal clock ICLK. The control signal ACT1 is fixed to low level.

This time the counter 142 performs the count operation and makes the impedance of the replica buffer 130 close to the value of the replica buffer 120. When the adjustment step is performed up to eight times, as shown in FIG. 9, the control signal ZQCOM is changed to low level again. The content of the flag 162 is inverted accordingly and clocking of the control signal ACT2 is stopped. The count value of the counter 142 is fixed and the level of the impedance control signal DRZQN (DRZQN1 to DRZQN5) is determined. Since, as the control signal ACT1 is fixed to low level, the impedances of the replica buffers 110 and 120 are fixed.

The short calibration operation has been described. The impedance control signals DRZQP and DRZQN determined by the calibration operation are provided to the pre-stage circuit 230 shown in FIG. 6. For the output buffer 210 controlled by the pre-stage circuit 230, the set content of the replica buffer is reflected.

In the present embodiment, every time the short calibration command ZQCS is issued, the calibration operation of the pull-up replica buffer 110 and the calibration operation of the pull-down replica buffer 130 are performed alternately. Therefore, even if only a few adjustment steps are performed in a calibration period, the impedance is adjusted more reliably.

The number of adjustment steps that can be performed in a calibration period is the same as in the conventional calibration circuit. However, as described above, generally, the impedance is not updated during the first adjustment step. This is because the counter included in the calibration circuit usually updates the impedance depending on whether the output value of the comparator is changed from the previous one. If a short calibration period is divided into the first half and the second half as in the conventional calibration circuit, the actual number of updates of the impedance is significantly reduced. On the contrary, in the present embodiment, the entire short calibration period is assigned to the pull-up or pull-down side. Therefore, comparing to conventional cases, the number of updates of the impedance is increased.

Because the number of updates of the impedance is reduced in the conventional calibration circuit, the pull-up replica buffer usually cannot be adjusted to the target value in a short calibration operation. In the pull-down replica buffer, the impedance deviated from the original target value is set as the target value. Accordingly, the impedance may be adjusted so as to be deviated from the original target value, and in this case, the accurate calibration operation is not maintained. In the present invention, such a problem is suppressed as compared to conventional cases, because the number of updates of the impedance is increased in the present embodiment.

The long calibration operation will be described.

Figure 12:
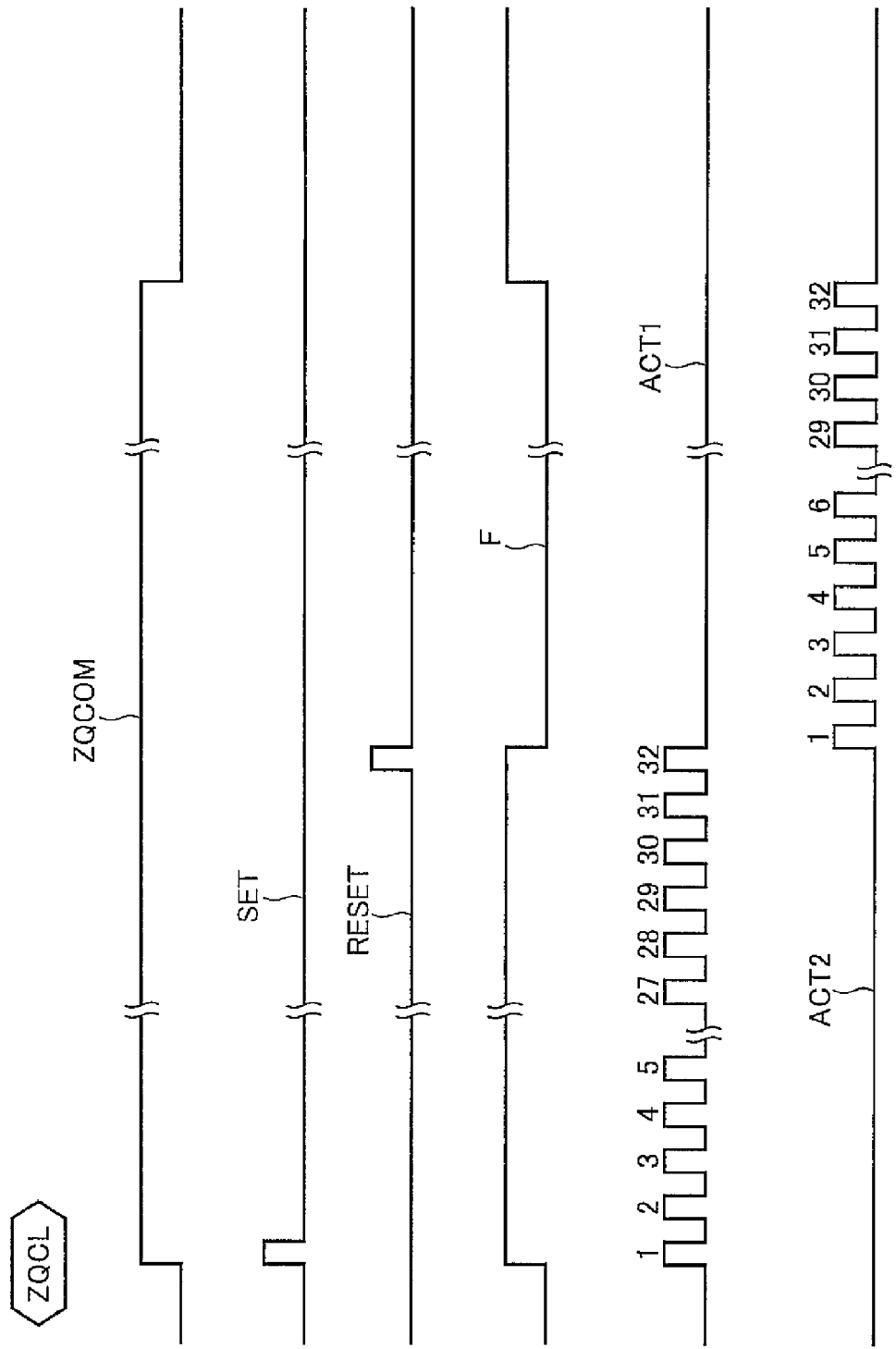
FIG. 12 is a timing diagram for explaining the long calibration operation.

FIG. 12 is a timing diagram for explaining the long calibration operation.

As shown in FIG. 12, when the long calibration command ZQCL is issued, the control signal ZQCOM is changed from low level to high level and the set signal SET is activated. The flag 162 is then set forcibly and clocking of the control signal ACT1 is performed. The counter 141 provides the count operation so as to make the impedance of the replica buffer 110 close to the value of the external resistor R.

When the half of the calibration period elapses, the reset signal RESET is activated and the content of the flag 162 is reset. Namely, the output F of the flag 162 is changed to low level and clocking of the control signal ACT2 begins. The counter 142 then provides the count operation so as to make the impedance of the replica buffer 130 close to the value of the replica buffer 120.

Assume that the long calibration period is 512 clocks and the number of divisions is 8, in the first half of the calibration period, the adjustment step is performed upon the pull-up replica buffer 110 up to 32 times. In the second half of the calibration period, the adjustment step is performed upon the pull-down replica buffer 130 up to 32 times.

According to the long calibration operation that ensures sufficient number of adjustment steps, unlike the short calibration operation, the calibration period is divided into the first half and the second half. During a long calibration operation, both the calibration operation for the pull-up replica buffer 110 and the calibration operation for the pull-down replica buffer 130 can be performed.

The present invention can preferably apply to the semiconductor memory device, especially a DRAM.

Figure 13:
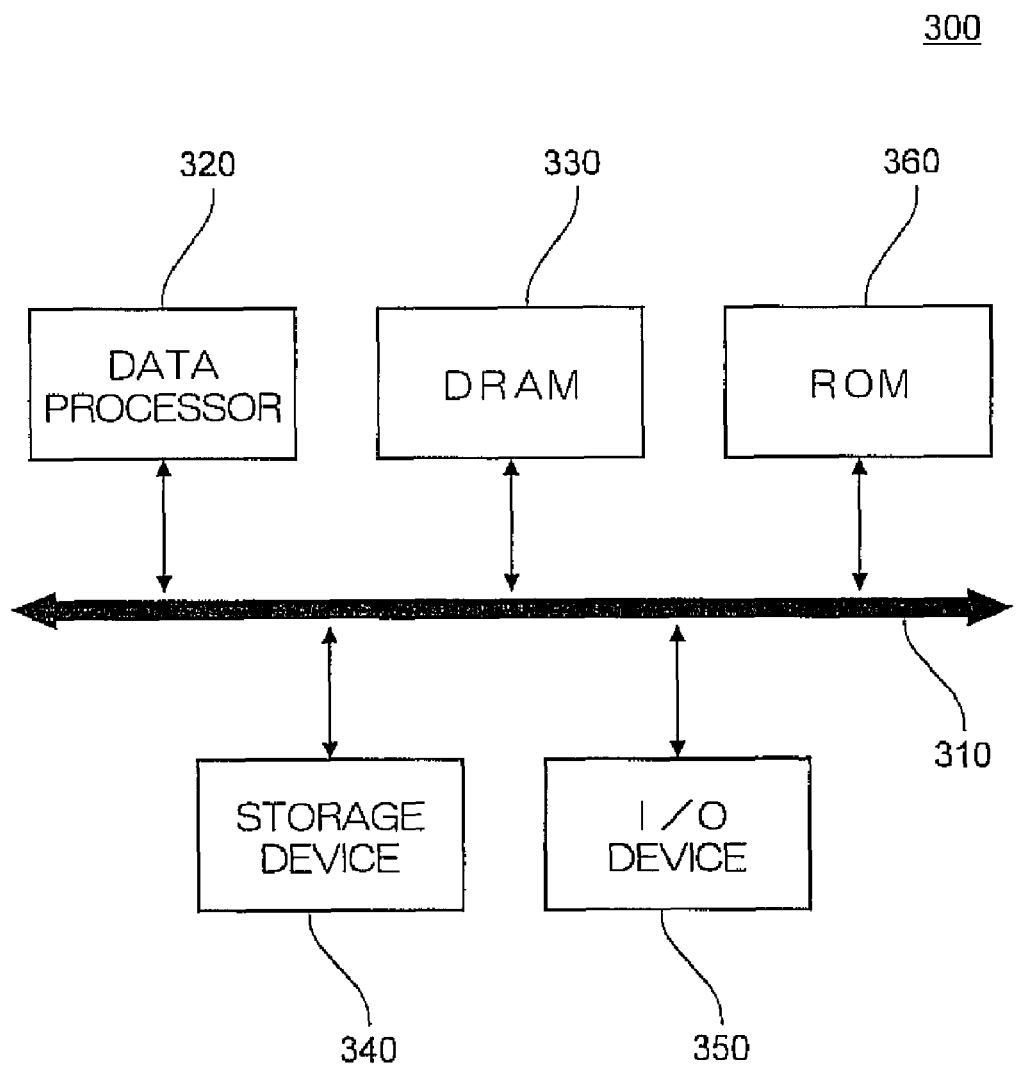
FIG. 13 is a block diagram showing a data processing system using the DRAM that the present invention is applied.

FIG. 13 is a block diagram showing a data processing system using the DRAM that the present invention is applied.

The data processing system 300 shown in FIG. 13 includes a data processor 320 and a DRAM 330 that the present invention is applied are connected to each other via a system bus 310. The data processor 320 can be selected from at least a microprocessor (MPU) and a digital signal processor (DSP). In FIG. 13, although the data processor 320 and the DRAM 330 are connected via the system bus 310 in order to simplify the diagram, they can be connected via not the system bus 310 but a local bus.

Further, in FIG. 13, although only one set of system bus 310 is employed in the data processing system 300 in order to simplify the diagram, a serial bus or a parallel bus connected to the system bus 310 via connectors can be provided. As shown in FIG. 13, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 13, two or more same elements can be provided in the data processing system.

The present invention is in no way limited to the aforementioned embodiments, but rather various modifications are possible within the scope of the invention as recited in the claims, and naturally these modifications are included within the scope of the invention.

For example, the size of the transistors that constitute the replica buffers 110 and 120, and 130 can be different from that of the transistors that constitute the output buffer 210. If their impedances are substantially the same with each other, shrunk transistors can be also utilized.

While the parallel circuit of five transistors is used as the parallel circuit that constitutes the output buffer or the replica buffer in the present embodiment, the number of transistors connected in parallel is not limited to that number.

According to the present invention, when a first calibration command is issued, not both a calibration operation for a first replica buffer and a calibration operation for a second replica buffer but either of them is performed. Accordingly, the number of updates of impedance in a calibration period is increased, and even if the frequency of an external clock is high, a sufficient calibration operation can be performed.

What is claimed is:

1. A calibration circuit for adjusting an impedance of an output buffer having a pull-up circuit and a pull-down circuit, the calibration circuit comprising:
a first replica buffer provided correspondingly to one of the pull-up circuit and the pull-down circuit; and
a second replica buffer provided correspondingly to the other of the pull-up circuit and the pull-down circuit, wherein
in response to an issuance of a first calibration command, a calibration operation is performed on one of the first and second replica buffers while postponing performing the calibration operation on the other of the first and second replica buffers until a subsequent issuance of the first calibration command, and in response to an issuance of a second calibration command, the calibration operation is performed on both the first replica buffer and the second replica buffer.

2. The calibration circuit as claimed in claim 1, further comprising a flag for determining a replica buffer that should perform the calibration operation, wherein the content of the flag is inverted every time the first calibration command is issued.

3. A calibration circuit for adjusting an impedance of an output buffer having a pull-up circuit and a pull-down circuit, the calibration circuit comprising:
a first replica buffer provided correspondingly to the pull-up circuit of the output buffer;
a second replica buffer provided correspondingly to the pull-down circuit of the output buffer; and
a control circuit responding to a first calibration command to perform a first calibration operation on the first replica circuit and a second calibration operation on the second replica circuit so that the first calibration operation is performed in response to an occurrence of the first calibration command while suspending the second calibration operation until a different occurrence of the first calibration command and the second calibration operation is performed in response to the different occurrence of the first calibration command.

4. The circuit as claimed in claim 3, wherein the control circuit further responds to a second calibration command to perform both of the first and second calibration operations prior to a next occurrence of the second calibration command.

5. The circuit as claimed in claim 4, wherein the first calibration command identifies a first calibration period of time and the second calibration command identifies a second calibration period of time, the first calibration period of time being shorter than the second calibration period of time.

6. The circuit as claimed in claim 5, wherein the second calibration period of time includes first and second time zones, and the first and second calibration operations are performed during the first and second time zones, respectively.

7. The circuit as claimed in claim 3, wherein the control circuit performs one of the first and second calibration operations in response to each of even-numbered occurrences of the first calibration command and the other of the first and second calibration operations in response to each of odd-numbered occurrences of the first calibration command.

8. A device with a calibration circuit that adjusts an impedance of an output buffer having a pull-up circuit and a pull-down circuit, comprising:
a first replica circuit provided correspondingly to the pull-up circuit of the output buffer;
a second replica circuit provided correspondingly to the pull-down circuit of the output buffer; and
a control circuit configured to respond to plural occurrences of a first calibration command to perform a calibration operation, the calibration operation including a first calibration operation on the first replica circuit and a second calibration operation on the second replica circuit, and one of the first and second calibration operations being performed in response to an occurrence of the first calibration command while deactivating the other of the first and second calibration operations until a next occurrence of the first calibration command and the other of the first and second calibration operations being performed in response to the next occurrence of the first calibration command while deactivating one of the first and second calibration operation until a further next occurrence of the first calibration command.

9. The circuit as claimed in claim 8, wherein the control circuit further responds to a second calibration command to perform both of the first and second calibration operations prior to a next occurrence of the second calibration command.

10. The circuit as claimed in claim 9, wherein the first calibration command identifies a first calibration period of time and the second calibration command identifies a second calibration period of time, the first calibration period of time being shorter than the second calibration period of time.

11. The circuit as claimed in claim 10, wherein the second calibration period of time includes first and second time zones, and the first and second calibration operations are performed during the first and second time zones, respectively.

12. The circuit as claimed in claim 8, wherein the control circuit performs one of the first and second calibration operations in response to each of even-numbered occurrences of the first calibration command and the other of the first and second calibration operations in response to each of odd-numbered occurrences of the first calibration command.

* * * * *